United States Patent
Vezyrtzis et al.

(10) Patent No.: US 11,309,874 B1
(45) Date of Patent: Apr. 19, 2022

(54) SEQUENTIAL ELEMENTS WITH PROGRAMMABLE FEEDBACK TO PROGRAM LEAKAGE IN ASICS

(71) Applicant: Bitmain Development Inc., Dover, DE (US)

(72) Inventors: Christos Vezyrtzis, San Jose, CA (US); Peter Holm, Seattle, WA (US); Steve Beccue, Frazier Park, CA (US)

(73) Assignee: Bitmain Development Inc., Dover, DE (US)

( * ) Notice: Subject to any disclaimer, the term of this patent is extended or adjusted under 35 U.S.C. 154(b) by 0 days.

(21) Appl. No.: 17/246,211

(22) Filed: Apr. 30, 2021

(51) Int. Cl.
*H03K 3/356* (2006.01)

(52) U.S. Cl.
CPC ..................... *H03K 3/356* (2013.01)

(58) Field of Classification Search
CPC ........................................ H03K 3/356
USPC .......................................... 327/211
See application file for complete search history.

(56) References Cited

U.S. PATENT DOCUMENTS 8,531,208 B2 * 9/2013 Jung ............... G01R 31/318541
326/46
10,084,460 B2 * 9/2018 Deng ..................... G06F 30/30

FOREIGN PATENT DOCUMENTS

CN         103166602 A  *  6/2013    ......... H03K 3/35625

* cited by examiner

*Primary Examiner* — Metasebia T Retebo
(74) *Attorney, Agent, or Firm* — Jon E. Gordon; Haug Partners LLP

(57) ABSTRACT

Power dissipation of sequential static latch, implemented in CMOS, may be reduced by removing clocked elements from the circuit. One way to do this may be to replace a clocked digital feedback path with an analog programmable feedback path. An analog programmable feedback path, such as disclosed, may, for example, provide a constant, non-clocked bias by providing constant bias voltages to transistors in the feedback path such that they function as analog devices rather than digital switches. This bias may be adjusted, e.g., to reflect the circuit's operating environment.

6 Claims, 7 Drawing Sheets

SEQUENTIAL ELEMENTS WITH PROGRAMMABLE FEEDBACK TO PROGRAM LEAKAGE IN ASICS

BACKGROUND

A latch is the simplest data storage element. (FIG. 1 depicts conceptually a latch 100.) The latch output Q 110 copies the input D 120 after a small delay when the clock pulse (CP) 130 equals 1 (logic high) but does not reflect D 120 when CP=0 (logic low). In typical usage, circuit timing is provided by clock cycles, and CP=1 for a single relatively short pulse, once every clock cycle.

As known in the art, a latch may have different inputs, outputs, or both, from the latch 100 that FIG. 1 depicts. For example, a latch may have an output QN (not pictured), which follows the inverse or complement of input D when CP=1. As another example, a latch may have, in addition to the CP input 130, a CPN input (not pictured) that must have the complementary value to CP 130.

The latch 100 internally stores a copy 140, also called "state", of the input or its complement. The internal copy 140 is updated every time CP=1.

A latch may be either static or dynamic, and each kind of latch has advantages and disadvantages. A static latch holds its state indefinitely so long as the circuit is powered. A dynamic latch, on the other hand, holds its state for only a finite time. Therefore, in typical use, a dynamic latch is refreshed periodically, renewing the state before it is lost.

A static latch does not lose state due to electrical leakage within the circuit element and therefore does not require refresh circuitry. Static latches also can be very fast when storing new data. But they require more transistors than dynamic latches and therefore take up more space on a die and dissipate more power.

Dynamic latches, conversely, require fewer transistors than static latches and therefore take up less space on a die and dissipate less power. But leakage means that the latch must be periodically refreshed or it may lose its state, and the need for periodic refresh may increase circuit complexity. What's more, leakage, and therefore instability, may be particularly significant in circuits that operate with low voltages to save power, such as certain kinds of ASICs, for example.

Dynamic latches are often considered more attractive than static ones, but they aren't suitable in some circumstances. For example, if a dynamic latch has unacceptably high leakage for a particular application, it may be redesigned to reduce leakage. The redesign, however, may make the latch too slow when storing new data. The simplest and most efficient dynamic latches may have non-tolerable leakage for the target operating frequency, or (due to on-chip variation) some individual latches within a chip may show more leakage than is acceptable in some application. In lower supply voltages, static latches are a safe option for storing digital data, but their power consumption may be higher than desired.

What is needed, therefore, is a circuit element that provides the stability of a static latch at low voltage but without the associated power consumption.

BRIEF SUMMARY OF THE INVENTION

Embodiments of the invention implement a new design for a static latch that uses programmable feedback to ensure that the latch maintains data regardless of transistor leakage, while using much less power than conventional static latches.

In an embodiment of the invention, a latched sequential circuit element comprises a front end, which in turn comprises a data input, a clock input (CPP), and a negative clock input (CPN) and is configured to have an output connected to an internal node. The latched sequential circuit element further comprises a first inverter with an input connected to an internal node and an output connected to an output node. And the latched sequential circuit element further comprises an analog programmable feedback path. The analog programmable feedback path comprises a second inverter with an input connected to the internal node and an output connected to a feedback node, and an analog-biased inverter with an input connected to the feedback node and an output connected to the internal node.

According to an embodiment of the invention, the analog-biased inverter comprises, in series, a first nMOS transistor, a second nMOS transistor, a first pMOS transistor, and a second pMOS transistor, each transistor having its own respective gate, source, and drain. The gate of the first nMOS transistor is connected to the feedback node, the source of the first nMOS transistor is connected to VSS, and the drain of the first nMOS transistor is connected to the source of the second nMOS transistor. The gate of the second nMOS transistor is held to a first analog bias voltage VBFBN, and the drain of the second nMOS transistor is connected to the internal node. The gate of the first pMOS transistor is held to a second analog bias voltage VBFBP, the drain of the first pMOS transistor is connected to the internal node, and the source of the first pMOS transistor is connected to the drain of the second pMOS transistor. And the gate of the second pMOS transistor is connected to the feedback node, and the source of the second pMOS transistor is connected to VDD.

According to a further embodiment of the invention, the front end is a tri-state front end.

According to a still further embodiment, the tri-state front end comprises, in series, a third nMOS transistor, a fourth nMOS transistor, a third pMOS transistor, and a fourth pMOS transistor, each transistor having its own respective gate, source, and drain. The gate of the third nMOS transistor is connected to the data input, the source of the third nMOS transistor is connected to VSS, and the drain of the third nMOS transistor is connected to the source of the fourth nMOS transistor. The gate of the fourth nMOS transistor is connected to CPP, and the drain of the fourth nMOS transistor is connected to the internal node. The gate of the third pMOS transistor is connected to CPN, the source of the third pMOS transistor is connected to the internal node, and the drain of the third pMOS transistor is connected to the drain of the fourth pMOS transistor. And the gate of the fourth pMOS transistor is connected to the data input, and the source of the fourth pMOS transistor is connected to VDD.

In embodiments, the first inverter is also the second inverter. Alternatively, in embodiments, the first inverter is not the second inverter.

Alternatively, according to an embodiment of the invention, the front end is a pass-gate consisting of a third nMOS transistor and a third pMOS transistor, each of the third nMOS transistor and the third pMOS transistor having its own respective gate, source, and drain. The source of the third nMOS transistor is connected to the source of the third pMOS transistor, and the drain of the third nMOS transistor is connected to the drain of the third pMOS transistor. Either the mutually connected sources or the mutually connected drains are connected to the data input, and the mutually connected terminals that are not connected to the data input are connected to the internal node. And the gate of the third nMOS transistor is connected to CPP, and the gate of the third pMOS transistor is connected to CPN.

DETAILED DESCRIPTION OF PREFERRED EMBODIMENTS

Figure 1:
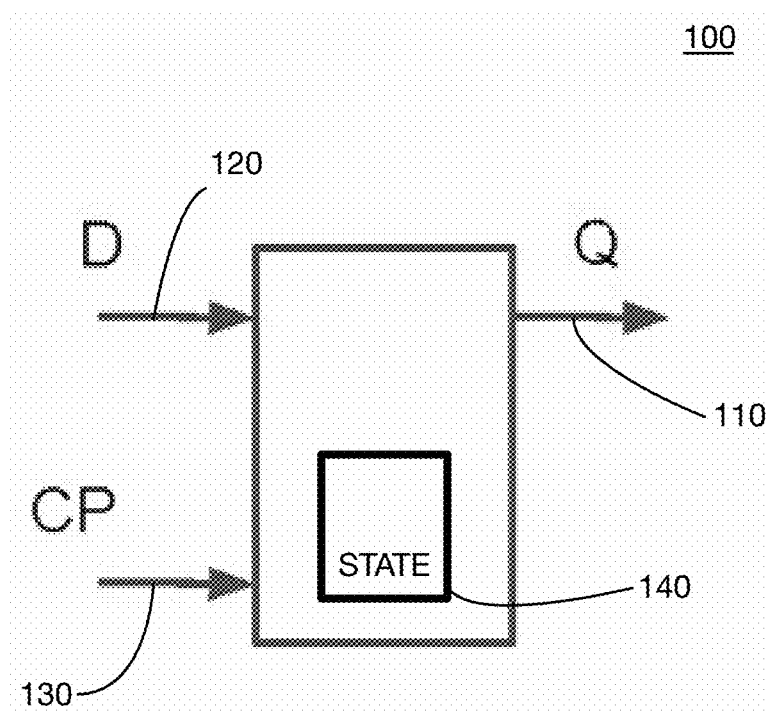
FIG. 1 depicts conceptually a latch.
Figure 2:
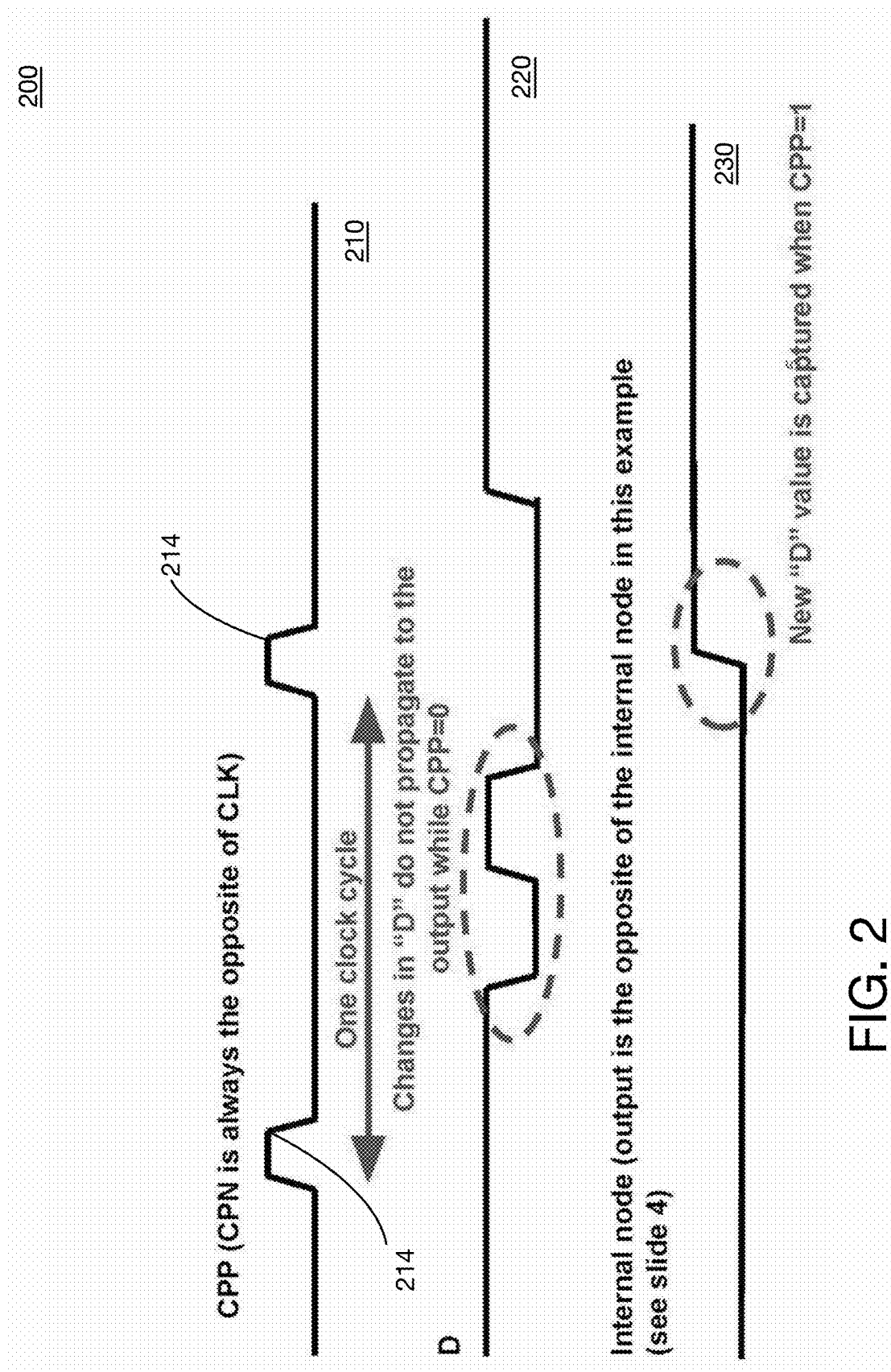
FIG. 2 depicts conceptually timing of a latch.

FIG. 1, discussed previously, depicts conceptually inputs and outputs of a simple latch 100. FIG. 2 illustrates relationships 200 between those inputs and outputs. In FIG. 2, the CPP input is a signal 210 that is low most of the time except for brief pulses 214 that repeat at a fixed clock interval. (As discussed, there may for some latches also be a signal CPN (not pictured) that complements CPP.) The data signal 220 (input to the latch 110 at input D 120) may vary over time, but the value 230 of the internal node can change only during a clock pulse 214. While CPP=1, the value of D 220 is captured and stored in the internal node. (In some latch designs, the output 110 of the latch takes the opposite logical value from that of the internal node.)

Figure 3:
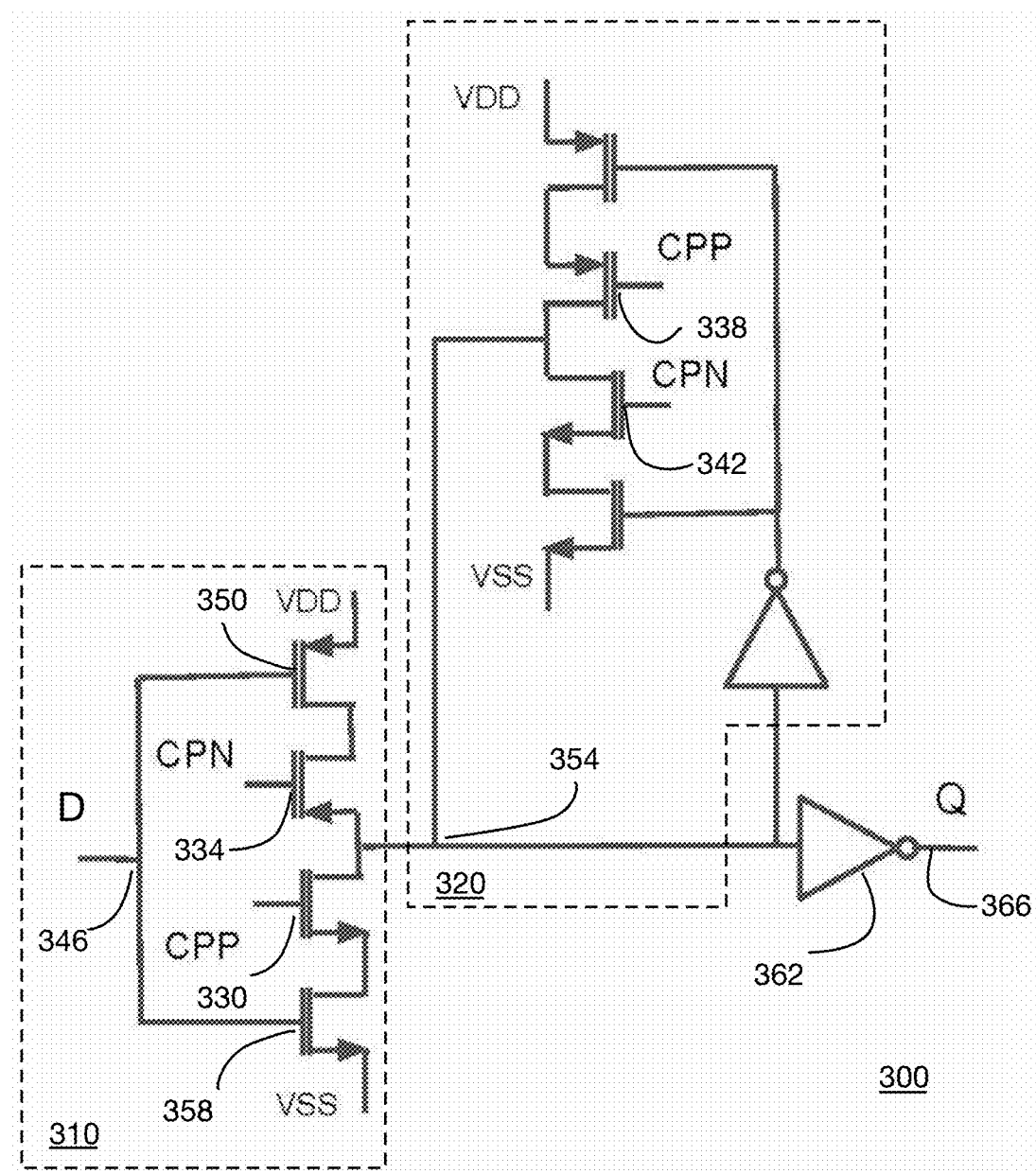
FIG. 3 depicts an example implementation of a static latch.

FIG. 3 is a schematic depicting an implementation of an exemplary static latch 300. As depicted, the latch 300 has two main parts: a front end 310 to store new data when CPP=1 (CPN=0); and a feedback path 320 to keep data when CPP=0 (CPN=1).

When CPP=1, then in the front end 310, CPP turns on transistor 330, and CPN turns on transistor 334. In the feedback path, though, CPP turns off transistor 338, and CPN turns off transistor 342, blocking the feedback path. Depending on the input D 346, either transistor 350 is turned on, setting the internal node 354 to 1, or transistor 358 is turned on, setting the internal node 354 to 0. The internal node 354 is input to an inverter 362, which, in the depicted circuit, sets the output Q 366 equal to the input D 346.

Conversely, when CPP=0, transistors 330 and 334 in the front end 310 are turned off, isolating the input D 346 from the internal node 354. Transistors 338 and 342 in the feedback path 320 are turned on, however, and the feedback maintains the value of the internal node 354.

Figure 4:
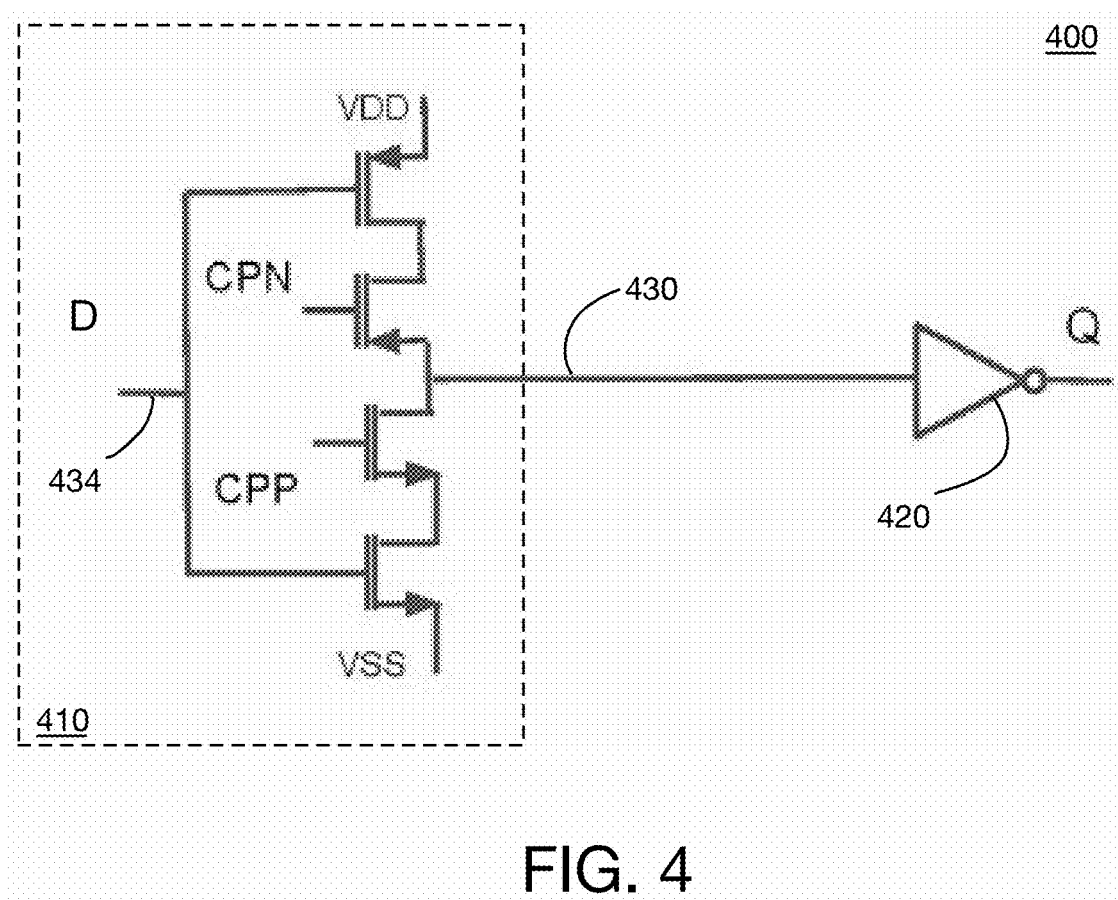
FIG. 4 depicts an example implementation of a dynamic latch.

A dynamic latch may be any latch that is not able to maintain its state indefinitely while power is supplied. FIG. 4 depicts an example embodiment of a dynamic latch 400. As depicted, the dynamic latch 400 is identical to the static latch 300 of FIG. 3, but without the feedback path 320. Thus, the dynamic latch of FIG. 4 consists of a front end 410 and an inverter 420.

When CPP=1, the front end 410 of the dynamic latch sets the internal node 430 equal to the input D 434. When CPP=0, as with the static latch, the front end 410 isolates the internal node 430 from the input D 434. But the internal state is maintained only by the input capacitance of the inverter 420. The latch 400 has leakage, however, which means that this state is lost at some particular rate and needs to be refreshed periodically, e.g., when the latch 400 takes a new CPP=1 pulse.

The advantage of the dynamic latch 400 as FIG. 4 depicts is apparent on comparison with the static latch 300 of FIG. 3. Compared to the static latch 300, the dynamic latch 400 has half as many transistors. This means that a dynamic latch 400 can be smaller and dissipate less power than the static latch 300.

Virtually all power dissipation in a CMOS element is dynamic dissipation, i.e., dissipation that takes place when the element changes state. The dissipation is consequent to the charging and discharging of gate capacitances as the transistors turn off and on. Although static dissipation is not exactly zero, it is typically negligible.

Thus, although eliminating transistors outright is one way to reduce dissipation, another approach may be to reduce the number of transistors that change state, e.g., per clock cycle.

Figure 5:
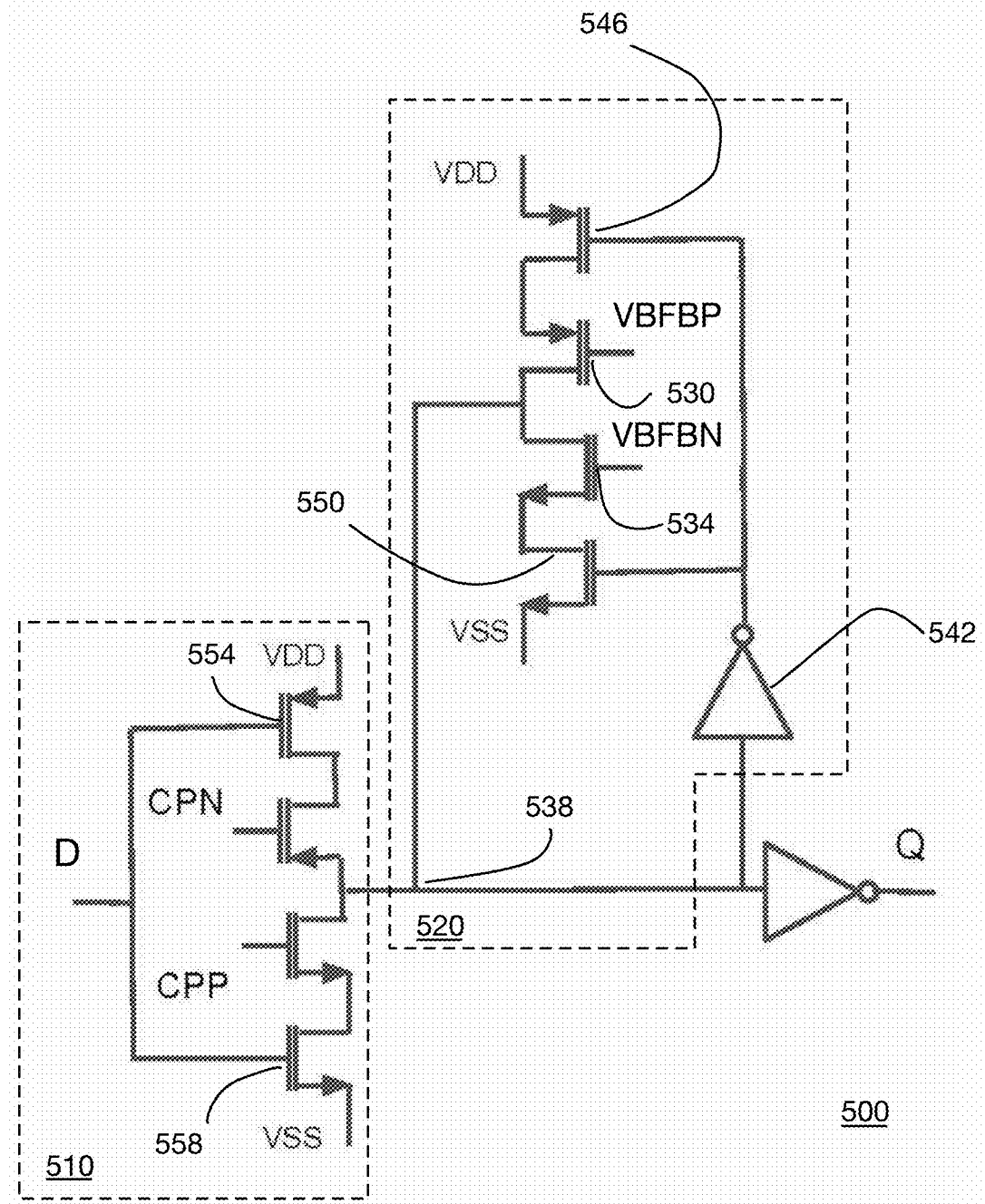
FIG. 5 depicts a latched sequential circuit element according to an embodiment of the invention.

FIG. 5 is a schematic of a sample static latch 500 according to an embodiment of the invention, which takes just that approach. This latch 500 resembles the static latch 300 that FIG. 3 depicts. Like that static latch 300, the latch 500 of FIG. 5 has a front end 510 to store new data when CPP=1 (CPN=0); and a feedback path 520 to keep data.

But in FIG. 5, the feedback is not controlled by CPP and CPN. Rather, in the embodiment that FIG. 5 depicts, the feedback strength is controlled by two analog voltages. As depicted, the feedback path 520 includes a pMOS transistor 530 controlled by a positive bias voltage designated VBFBP and an nMOS transistor 534 controlled by a negative bias voltage designated VBFBN. Unlike CPP and CPN, In embodiments of the invention, these bias voltages may remain substantially constant during operation of the device, disregarding, e.g., minor transient variations in the supplied voltages due to operation of other devices.

Because the feedback path 520 is always on in embodiments of the invention, changing the state of the internal node 538 may entail, in a sense, "fighting" the feedback as the state change begins. For example, when the internal node is 0, the output of inverter 542 is 1, turning pMOS transistor 546 off and turning nMOS transistor 550 off. The internal node is thus held to VSS through transistor 534 and retains the value 0. This feedback remains present, however, when the front end 510 presents a 1 to the internal node 538; and an output current may flow from the front end 510, through the transistors 534, 550 until the gate capacitor of inverter 542 is sufficiently charged that the inverter 542 changes state.

A similar situation obtains when internal node is 1, but with the path existing through transistor 530 to VDD.

Thus, in an embodiment such as FIG. 5 depicts, a static latch 500 has only two clocked transistors 554, 558. This is the same number of clocked transistors as in the dynamic latch 400 (FIG. 4), which implies that the dissipation of latch 500 (FIG. 5) may essentially equal the dissipation of the dynamic latch 400 (FIG. 4), which is much less than the dissipation of the static latch 300 of FIG. 3.

This is true even though, as will be appreciated, some power dissipation is expected when the latch 500 changes state. For example, some power is dissipated in overcoming the feedback as the state changes, and the change in state also implies changing the states of transistors 546 and 550. But it is expected that most latches 500 will not change state every clock cycle, and the resulting power dissipation can be expected to resemble that of the dynamic latch 400 (FIG. 4).

Returning to FIG. 5, in an embodiment of the invention, the leakage through the feedback path may be controlled, e.g., by adjusting the bias voltages VBFBP and VBFBN. The feedback strength may also be adjusted, e.g., in response to the device's operating frequency. For example, increasing the feedback may improve the static operation of the latch 500, but it may also increase the time needed to overcome the feedback when changing the state of the internal node 538.

According to embodiments of the invention, a device (not pictured) may comprise multiple latches 500 such as FIG. 5 depicts. In such embodiments, bias voltages for these multiple latches may, e.g., come from a common source and thus be adjusted together. In embodiments, the bias voltages for one or more of the latches 500 may be separately adjustable.

According to embodiments of the invention, a device (not pictured) having multiple latches 500 may have one or more groups of latches 500. In such embodiments, all latches 500 in a single group may share bias voltages, but bias voltages may be adjusted separately from group to group.

Figure 6:
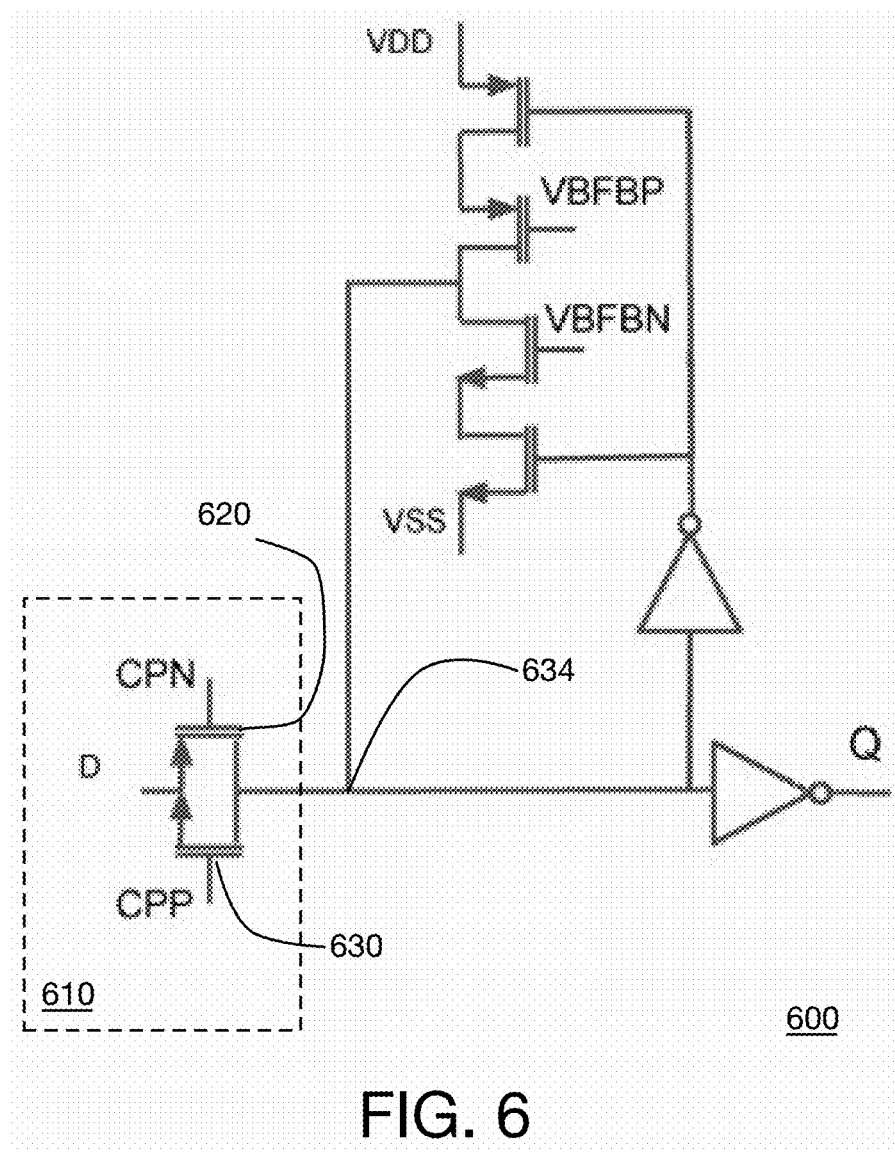
FIG. 6 depicts a latched sequential circuit element according to a first alternative embodiment of the invention.

FIG. 6 depicts a latch 600 according to an alternative embodiment of the invention. The depicted latch 600 resembles the latch 500 of FIG. 5, but instead of the front end 510 that FIG. 5 depicts, FIG. 6 depicts latch 600 in which a transmission gate 610 serves as the front end. The pMOS transistor 620 conducts when CPN=0, and the nMOS transistor 630 conducts when CPP=1, allowing input D to pass through to the internal node 634. Otherwise, when CPN=1 and CPP=0, the transmission gate 610 will isolate the input from the internal node 634. Relative to the latch 500 (FIG. 5), a latch 700 (FIG. 7) according to an embodiment of the invention may include fewer components but may also result in a greater load on the source (not pictured) of D than the front end 510 that FIG. 5 depicts.

Figure 7:
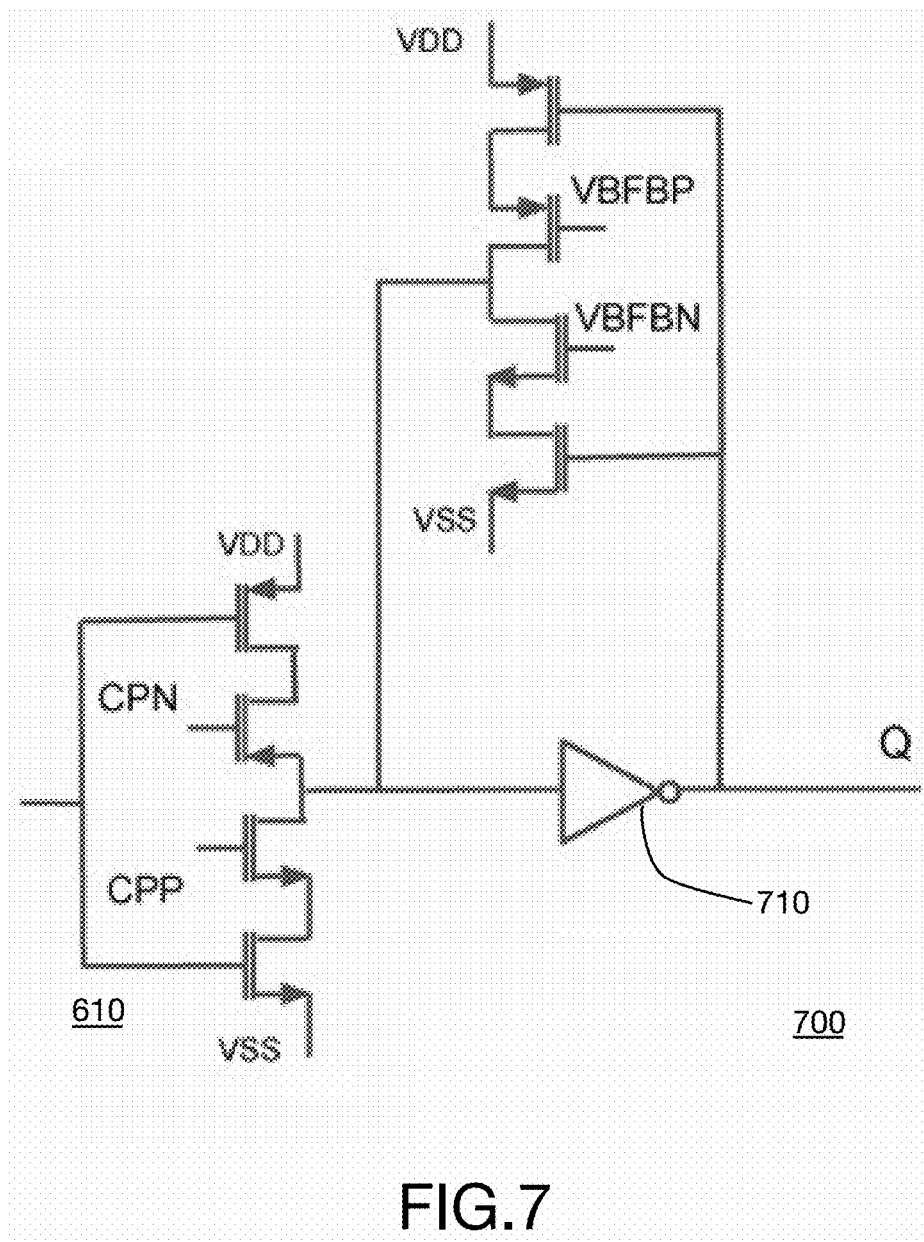
FIG. 7 depicts a latched sequential circuit element according to a second alternative embodiment of the invention.

FIG. 7 depicts a latch 700 according to an alternative embodiment of the invention. The depicted latch also resembles the latch 500 of FIG. 5, but the latch 700 of FIG. 7 uses only a single inverter 710 for both feedback and output. Relative to the latch 500 (FIG. 5), a latch 700 (FIG. 7) according to an embodiment of the invention may include fewer components but may also not be able to drive as large a capacitive load.

It will be appreciated that the modifications of FIG. 6 and FIG. 7 may in an embodiment of the invention be combined to create a latch (not pictured) with a transmission gate and a single inverter.

The invention claimed is:

1. A latched sequential circuit element, comprising:
   a front end comprising a data input, a clock input (CPP), and a negative clock input (CPN) and configured to have an output connected to an internal node;
   a first inverter with an input connected to the internal node and an output connected to an output node; and
   an analog programmable feedback path comprising
      a second inverter with an input connected to the internal node and an output connected to a feedback node, and
      an analog-biased inverter with an input connected to the feedback node and an output connected to the internal node;
   wherein:
      the analog-biased inverter comprises, in series, a first nMOS transistor, a second nMOS transistor, a first pMOS transistor, and a second pMOS transistor, each transistor having its own respective gate, source, and drain;
      the gate of the first nMOS transistor is connected to the feedback node, the source of the first nMOS transistor is connected to VSS, and the drain of the first nMOS transistor is connected to the source of the second nMOS transistor;
      the gate of the second nMOS transistor is held to a first analog bias voltage VBFBN, and the drain of the second nMOS transistor is connected to the internal node;
      the gate of the first pMOS transistor is held to a second analog bias voltage VBFBP, the drain of the first pMOS transistor is connected to the internal node, and the source of the first pMOS transistor is connected to the drain of the second pMOS transistor; and
      the gate of the second pMOS transistor is connected to the feedback node, and the source of the second pMOS transistor is connected to VDD.

2. The latched sequential circuit element of claim 1, wherein the front end is a tri-state front end.

3. The latched sequential circuit element of claim 2, wherein:
   the tri-state front end comprises, in series, a third nMOS transistor, a fourth nMOS transistor, a third pMOS transistor, and a fourth pMOS transistor, each transistor having its own respective gate, source, and drain;
   the gate of the third nMOS transistor is connected to the data input, the source of the third nMOS transistor is connected to VSS, and the drain of the third nMOS transistor is connected to the source of the fourth nMOS transistor;
   the gate of the fourth nMOS transistor is connected to CPP, and the drain of the fourth nMOS transistor is connected to the internal node;
   the gate of the third pMOS transistor is connected to CPN, the source of the third pMOS transistor is connected to the internal node, and the drain of the third pMOS transistor is connected to the drain of the fourth pMOS transistor; and
   the gate of the fourth pMOS transistor is connected to the data input, and the source of the fourth pMOS transistor is connected to VDD.

4. The latched sequential circuit element of claim 3, wherein the first inverter is also the second inverter.

5. The latched sequential circuit element of claim 3, wherein the first inverter is not the second inverter.

6. The latched sequential circuit element of claim 1, wherein:
   the front end is a pass-gate consisting of a third nMOS transistor and a third pMOS transistor, each of the third nMOS transistor and the third pMOS transistor having its own respective gate, source, and drain;
   the source of the third nMOS transistor is connected to the source of the third pMOS transistor, and the drain of the third nMOS transistor is connected to the drain of the third pMOS transistor;
   either the mutually connected sources or the mutually connected drains are connected to the data input, and the mutually connected terminals that are not connected to the data input are connected to the internal node;
   the gate of the third nMOS transistor is connected to CPP; and
   the gate of the third pMOS transistor is connected to CPN.

* * * * *